United States Patent [19]

Vig et al.

[11] 4,070,502

[45] Jan. 24, 1978

[54] METHOD OF TREATING PIEZOELECTRIC RESONATORS

[76] Inventors: John R. Vig, Bucks Mill Road, Colts Neck, N.J. 07722; Raymond L. Filler, 66 Old Port Road, Freehold, N.J. 07728

[21] Appl. No.: 683,598

[22] Filed: May 5, 1976

[51] Int. Cl.² .............................................. H03H 9/14
[52] U.S. Cl. ................................ 427/100; 333/30 R; 333/72; 29/25.35; 310/312; 427/125; 427/8
[58] Field of Search .......................... 427/100, 125, 8; 333/30 R, 72; 29/25.35; 310/8.9, 312

[56] References Cited

U.S. PATENT DOCUMENTS

| 2,546,321 | 3/1951 | Ruggles | 427/100 X |
| 3,028,262 | 4/1962 | Klingsporn | 427/100 X |
| 3,760,471 | 9/1973 | Borner | 427/100 X |
| 3,864,161 | 2/1975 | Thompson | 427/100 X |
| 3,959,747 | 5/1976 | Turski et al. | 333/30 R |
| 3,995,240 | 11/1976 | Kerbel | 333/30 R |

*Primary Examiner*—Ralph S. Kendall
*Attorney, Agent, or Firm*—Nathan Edelberg; Jeremiah G. Murray; Roy E. Gordon

[57] ABSTRACT

The apparent angle of cut of a quartz crystal resonator blank is shifted so as to give the quartz resonator a desired frequency versus temperature characteristic.

6 Claims, 2 Drawing Figures

METHOD OF TREATING PIEZOELECTRIC RESONATORS

The invention described herein may be manufactured, used and licensed by or for the Government for governmental purposes without the payment to us of any royalties thereon.

BACKGROUND OF THE INVENTION

This invention relates in general to a method of treating a quartz crystal resonator blank and in particular to a method of shifting the apparent angle of cut of a quartz resonator blank so as to give the quartz resonator a desired frequency versus temperature characteristic.

The frequency versus temperature characteristic of a quartz resonator depends primarily on the angle of cut of the quartz blank with respect to the natural crystallographic axes. The manner in which the frequency versus temperature characteristic depends on the angle of cut as described at pages 77 to 103 of "The Quartz Resonator Handbook-Manufacturing Guide for AT-Type Units," edited by R. E. Bennett, Union Thermoelectric Report, 1960, AD251289. When the quartz resonator is to be used for a TCXO (temperature compensated crystal oscillator), it is particularly important to precisely control the frequency versus temperature characteristic of the quartz resonator. For example, the angle tolerance on a TCXO crystal typically may be about ±30 secons of arc. Even if the cutting saw is set for the optimum angle of cut, the various processing operations shift the angles and the finished crystals have a large spread of angles. The angle of cut of each crystal blank is determined by X-ray diffraction, and only those blanks which have angles within the ±30 second range are selected for further processing. At the completion of the various processing steps, the number of crystals falling within the ±30 second range are, unfortunately, a small fraction of the crystals initially cut.

SUMMARY OF THE INVENTION

The general object of the invention is to provide a method of treating quartz crystal resonators. A more particular object of the invention is to provide such a method wherein the apparent angle of cut of a quartz resonator blank is shifted so as to give the quartz resonator a desired frequency versus temperature characteristic. A further object of the invention is to provide such a method in which quartz blanks whose angle of cut would normally lie outside of a useful range in terms of their frequency versus temperature characteristics are made useable. A particular object of this invention is to provide such a method in which the yield of useable crystal blanks for a TCXO is greatly increased.

It has now been found that the foregoing objects can be attained by a properly controlled bonding method involving measuring the angle of cut of the quartz blank, determining the shift in the apparent angle of cut required to give the quartz blank the desired frequency versus temperature characteristic, calculating the shape, area, thickness and orientation of the bonding agent to be deposited on the quartz blank so as to shift the angle of cut of the quartz blank from the "wrong angle" to the apparent angle of cut that will give the desired frequency versus temperature characteristic, depositing strongly adhering metallic films such as chromium-gold on the quartz blank that correspond to the required shape and orientation of the bonding area, and depositing a bonding agent on the bonding area.

The invention is based on the fact that the frequency versus temperature characteristics of resonators can be shifted from the values predicted by the angle of cut by depositing a strongly adherent film, such as a bonding agent, on the resonator. The shift is believed to occur because the strongly adherent film generally has a different thermal expansion coefficient than the quartz blank. As the temperature is changed, the adherent film exerts temperature dependent stresses on the resonator. The stresses shift the frequency of the resonator. However, since the stresses are temperature dependent so is the amount of the frequency shift. The stresses thus produce a change in the frequency versus temperature characteristic which appears as if the resonator blank had a different angle of cut; i.e. the stresses produce an apparent angle shift.

Although the use of quartz is particularly desirable, the method is also applicable to other piezoelectric crystals, such as lithium niobate, lithium tantalate, berlinite, etc. because the frequencies of other piezoelectric resonators are similarly affected by temperature dependent stresses.

The angle of cut of the piezoelectric material is measured by X-ray diffraction as is well known in the art. Then, the shift of the apparent angle of cut required to give the piezoelectric crystal the desired frequency versus temperature characteristic is determined. For AT-cut quartz resonators, for example, the required shift in apparent angle can be conveniently determined from the curve relating the normalized difference between turning point frequencies to the angle of cut, as measured from the reference angle.

Then the shape, area, thickness and orientation of the bonding agent to be deposited on the piezoelectric crystal is calculated. The particular shape, area, thickness and orientation selected will shift the angle of cut of the piezoelectric crystal from the "wrong angle" to the angle that will give the desired frequency versus temperature characteristic. The bonding shape, area and thickness is also dependent upon the particular application for which the piezoelectric crystal is to be used and on the range of angle shifts desired. In the case of a quartz crystal resonator to be used for low shock, high precision applications a small bonding area is usually selected. Where the quartz crystal resonator is to be capable of withstanding high shock levels, a bonding area is selected that covers a large strip around the circumference of the quartz blank, and the thickness is selected not only to shift the apparent angle but also to strengthen the blank at the edges. When the shape, area and thickness of the bonding area has been selected, then the orientation of the bonding area is determined by an experiment relating angle shift produced by the deposition of a given thickness of bonding agent onto the selected bonding area, to the orientation of the selected bonding area with respect to the crystallographic axes of the crystal blank. This experiment is carried out in the following manner: The bonding agent is first deposited onto the selected bonding area along the XX' direction of the quartz blank and the frequency versus temperature characteristic is measured. The bonding agent is then stripped from the quartz blank, and the same thickness, shape and area of bonding agent is redeposited along a direction 5° away from the XX' direction, and the frequency versus temperature characteristic is remeasured. The process is then continued in 5° increments until the ZZ' bonding orientation is reached. The same thickness, shape and area of bonding agent is deposited at each orientation. The ZZ' orientation is of course 90° from the XX' orientation. The apparent angle shifts from the angle of cut, as measured by X-ray diffraction, are calculated from the frequency versus temperature characteristics at each bonding orientation. A curve is then plotted relating angle shifts to the bonding orientations. From this curve, the bonding orientation required for each particular quartz blank is selected so as to assure that the resonator's apparent angle of cut is in the desired range.

The use of internal stress free nickel as the bonding agent is preferred. However, other metals or adhesives might also be used. Depending upon the particular bonding agent used, a separate curve must be made relating apparent angle shift to bonding orientation. Since the shifts produced by the bonding agents also depend on the thickness of the deposited agent, the shift versus orientation curves must be obtained at constant thickness.

DESCRIPTION OF THE DRAWING AND THE PREFERRED EMBODIMENT

Figure 1:
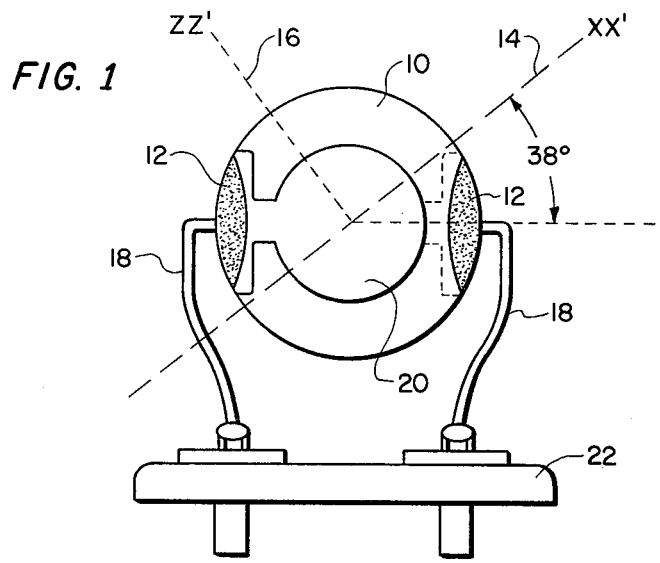
FIG. 1 shows the shape of the bonding area selected for a quartz blank that has been mounted and bonded along the orientation required to produce a desired shift in frequency versus temperature characteristic.
Figure 2:
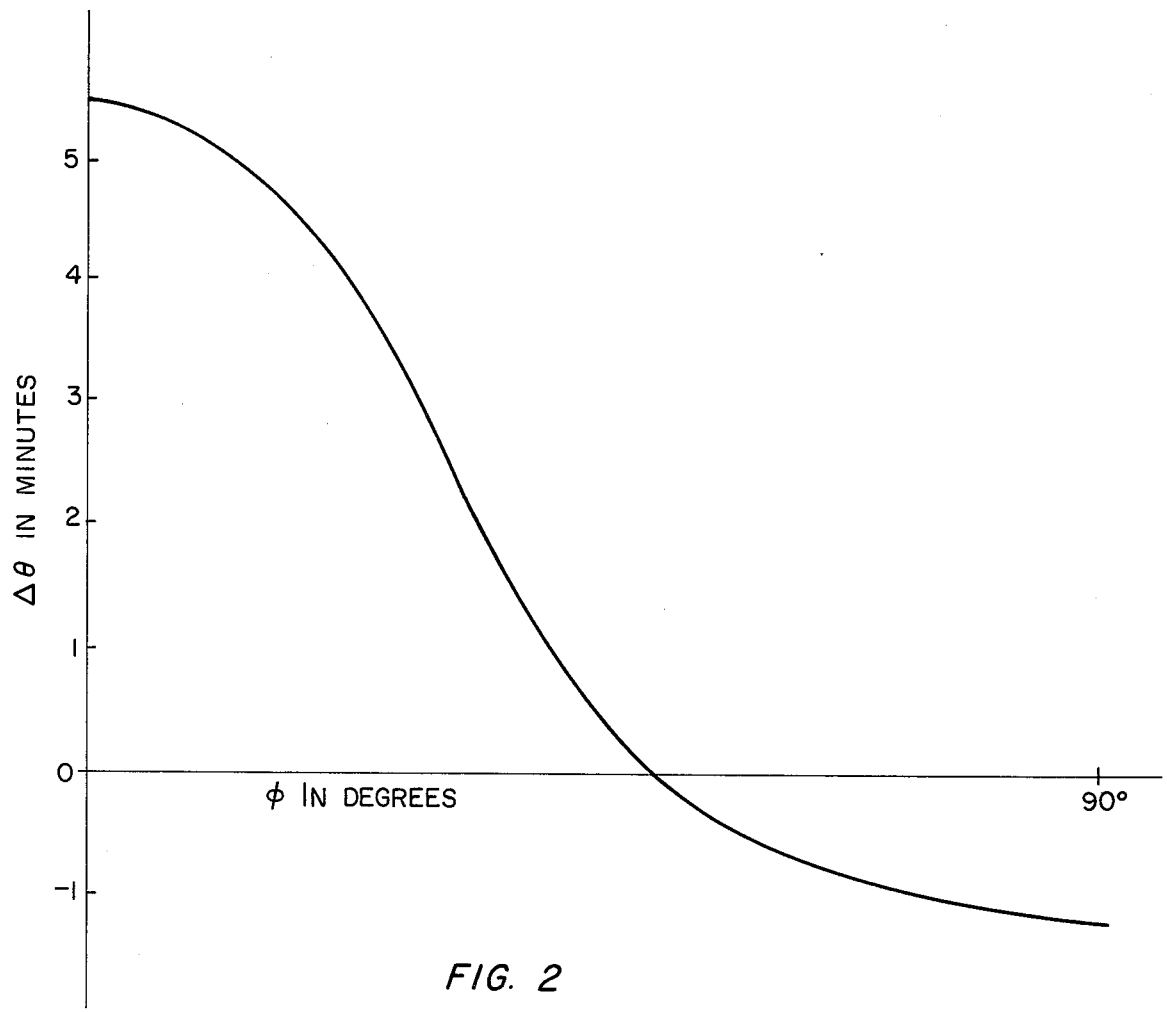
FIG. 2 is the curve relating angle shift to bonding orientation from which the selected bonding area and orientation for the quartz blank of FIG. 1 was chosen.

A particular TCXO requires a 20 megahertz fundamental mode AT-cut quartz resonator having an effective angle of cut of 35° 17' ±30". One of the quartz blanks, 10, is found by X-ray diffraction to have an angle of cut of 35° 14' 50" which is the wrong angle of cut. Thus, the angle of cut of the quartz blank must be shifted upward by about 2' 10" in order to make the quartz blank useable. The shape of the bonding area, 12, selected for the TCXO application in this case is shown in FIG. 1. The length of the bonded area, 12, is 2 millimeters and the width of the bonded area, 12, is 0.5 millimeter at the widest point. A curve is then prepared, such as shown in FIG. 2, relating angle shift, $\Delta\theta$, to bonding orientation, $\phi$, of the selected bonding area, using 50 micrometers thick electroplated nickel as the bonding agent. From the curve, it is determined that the selected bonding area, 12, for the quartz blank, 10, of FIG. 1 must be oriented along the direction 38° away from the XX' crystallographic axis, 14, of the quartz blank. The orientation of the ZZ' crystallographic axis, 16, for the quartz blank, 10, is also shown in FIG. 1.

In FIG. 2, $\phi$ is the bonding orientation, in degrees, measured from the XX' crystallographic axis of the resonator blank, 10, and $\Delta\theta$ is the angle shift, in minutes, defined by $$\Delta\theta = \text{(apparent angle) - (measured angle)},$$

where the apparent angle is determined from the frequency versus temperature characteristic, and the measured angle is the angle of cut of the quartz blank, as measured by X-ray diffraction. For the resonator of FIG. 1, with 50 micrometers of electroplated nickel as the bonding agent, the angle shift at $\phi = 0$ is +5.5 minutes; the angle shift at $\phi = 90°$ is −1.3 minutes.

Chromium gold spots are then vacuum deposited onto the area, 12, selected for bonding and the quartz blank, 10, is mounted in mounting clips. The quartz blank and mounting clips are then immersed in a nickel sulfamate electroplating solution and approximately 50 micrometers of internal stress free nickel is deposited to join the quartz blank to the mounting clips, 18. The fabrication of the quartz resonator is then completed by art established techniques involving baseplating the electrodes, 20, adjusting the frequency, and sealing hermetically in an enclosure, of which only the enclosure base, 22, is shown in FIG. 1. When the frequency versus temperature characteristic of the resulting resonator is measured, the resonator is found to have an effective angle of 35° 17' 15" which is the useable range.

Other modifications are seen as coming within the scope of the invention. For example, two large or several smaller chromium-gold strips can be deposited evenly spaced along the edges of all of the crystals prior to measuring the angle of cut. Immediately after measurement of the angle of cut and before the crystal is removed from the X-ray diffraction machine, the chrome gold bonding areas required to bring about the desired angle shift are selected and marked. The bonding agent is then deposited only onto the areas selected.

We wish it to be understood that we do not desire to be limited to the exact details described, for obvious modifications will occur to a person skilled in the art.

What is claimed is:

1. A method of shifting the apparent angle of cut of a piezoelectric resonator blank so as to give the piezoelectric resonator a desired frequency versus temperature characteristic including the steps of
   A. measuring the angle of cut of the piezoelectric resonator blank;
   B. determining the shift in apparent angle of cut required to give the piezoelectric resonator the desired frequency versus temperature characteristic;
   C. selecting the shape, area and thickness of a strongly adherent film to be deposited;
   D. determining the orientation on the piezoelectric resonator blank of the area selected so as to shift the apparent angle of cut of the piezoelectric blank to the value that will give the piezoelectric resonator the desired frequency versus temperature characteristic; and
   E. depositing the strongly adherent film onto the piezoelectric resonator blank at the orientation determined in step D, said strongly adherent film having the shape, area, and thickness selected in step C.

2. Method according to claim 1 wherein the material of the piezoelectric blank is selected from the group consisting of lithium niobate, lithium tantalate, berlinite and quartz.

3. Method according to claim 2 wherein the resonator blank material is quartz.

4. Method according to claim 3 wherein the shape, area, and thickness of the bonding area selected is dependent upon the particular application for which the quartz is to be used and wherein the orientation of the selected bonding area is determined by depositing bonding agent onto the selected bonding area along the XX' direction of the quartz blank, measuring the frequency versus temperature characteristic, stripping the bonding agent from the quartz blank and redepositing it along a direction 5° away from the XX' direction and remeasuring the frequency versus temperature characteristic, repeating the latter step in 5° increments until the ZZ' bonding orientation is reached, preparing a curve relating angle shift produced by the selected bonding area to orientation of the selected bondng area with respect to the crystallographic axis of the crystal blank, and selecting from the curve the bonding orientation required to produce the desired frequency versus temperature characteristic.

5. Method according to claim 1 wherein the strongly adherent film is obtained by first depositing a thin film of chromium-gold onto the piezoelectric resonator blank and then depositing a thicker film of nickel onto the chromium-gold.

6. Method according to claim 1 wherein the strongly adherent film is selected from the group consisting of metal and adhesive.

* * * * *